United States Patent [19]
Zibu

[11] 4,112,506
[45] Sep. 5, 1978

[54] RANDOM ACCESS MEMORY USING COMPLEMENTARY FIELD EFFECT DEVICES

[75] Inventor: Mituo Zibu, Ueno, Japan

[73] Assignee: Sharp Kabushiki Kaisha, Osaka, Japan

[21] Appl. No.: 837,287

[22] Filed: Sep. 27, 1977

[30] Foreign Application Priority Data

Oct. 7, 1976 [JP] Japan .................................. 51-121141

[51] Int. Cl.² ............................................. G11C 13/00
[52] U.S. Cl. .................................... 365/181; 307/290; 365/154
[58] Field of Search ....................... 307/238, 279, 290; 365/181, 154, 156

[56] References Cited

U.S. PATENT DOCUMENTS 4,063,225  12/1977  Stewart ................................. 365/181

*Primary Examiner*—Terrell W. Fears
*Attorney, Agent, or Firm*—Stewart, Kolasch & Birch

[57] ABSTRACT

A random access memory using complementary field effect transistors, comprising an array of a plurality of storing locations, address signal lines for addressing said plurality of storing locations, a data signal line commonly coupled to said plurality of storing locations for inputting/outputting a data signal, each said location comprising a flip-flop including first and second inverters cross connected to each other and each implemented by complementary field effect transistors, field effect switching transistors connected in series with said first inverter and to be non-conductive in a write operation mode, a transmission gate connected between the input/output node of said flip-flop and said data signal line to be operable as a function of the signal in said address signal line, said transmission gate comprising two complementary field effect switching transistors connected in parallel with each other, each individually responsive to the complementary states of the address signal in said address signal line, said random access memory further comprising a third inverter implemented by complementary field effect transistors and having the output connected to said data signal line, a field effect switching transistors connected in series with said third inverter and to be conductive in the write operation mode, and an output circuit having the input connected to said data signal line and implemented by complementary field effect transistors.

4 Claims, 3 Drawing Figures

RANDOM ACCESS MEMORY USING COMPLEMENTARY FIELD EFFECT DEVICES

BACKGROUND OF THE INVENTION

1. Field of the Invention

The present invention relates to a random access memory using complementary field effect devices. More specifically, the present invention relates to a static type random access memory implemented by complementary field effect transistors.

2. Description of the Prior Art

As well known, a random access memory comprises an array of a plurality of storing cells, address signal lines associated with said plurality of storing cells for addressing the said plurality of storing cells, and a data signal line commonly connected to the said plurality of storing cells for inputting/outputting a data signal. Of late, a typical random access memory is implemented by field effect devices. Some type of a random access memory may be implemented by complementary field effect devices.

FIG. 1 shows a schematic diagram of a typical prior art static type random access memory implemented by complementary field effect transistors. Referring to FIG. 1, each field effect transistor is shown by a well known symbol. As well known, complementary field effect transistors comprise a pair of field effect transistors which are different from each other or opposite to each other in terms of the conductivity type. Typically, the complementary field effect transistors comprise a pair of a P channel enhancement field effect transistor and an N channel enhancement field effect transistor. In the figure, a P channel enhancement field effect transistor is denoted by the reference character P indicated adjacent the symbol of the field effect transistor and an N channel enhancement field effect transistor is denoted by the reference character N indicated adjacent the symbol of the field effect transistor. It is pointed out that FIG. 1 shows only one storing cell, and an address signal line and data signal line to be connected thereto. The figure only shows a row address signal line, while a column address signal line is omitted.

Referring to FIG. 1, the circuit is shown connected between the voltage source +VDD and the ground GND. It is pointed out that, as far as the description in conjunction with FIG. 1 is concerned, the logical convention is adopted wherein the voltage level of the voltage source +VDD is handled as true or the logic one or the high level while the voltage level of the ground GND is handled as false or the logic zero or the low level.

The circuit diagram in FIG. 1 comprises one storing cell, as described above, which is implemented by a pair of inverters, one comprising a P channel enhancement field effect transistor T3 and an N channel enhancement field effect transistor T5 and the other comprising a P channel enhancement field effect transistor T3' and an N channel enhancement field effect transistor T5', and a pair of transmission gates, one comprising an N channel enhancement field effect transistor T2 and the other comprising an N channel enhancement field effect transistor T2'. The junction between the field effect transistors T3 and T5 is connected to the gate electrodes of the field effect transistors T3' and T5', while the junction between the field effect transistors T3' and T5' is connected to the gate electrodes of the field effect transistors T3 and T5, whereby a cross connection of the pair of inverters is implemented to form a flip-flop, which serves as a storing cell. A data signal line of the circuit shown comprises a pair of data signal lines L2 and L2' which are complementary to each other in terms of the logic. The field effect transistor T2 serving as a transmission gate is connected between the junction of the field effect transistor T3 and T5 and the data signal line L2, while the field effect transistor T2' serving as a transmission gate is connected between the junction of the field effect transistors T3' and T5' and the data signal line L2'. The gate electrodes of the field effect transistors T2 annd T2' are connected to an address signal line L1 which is to be used as a row address signal line. The data signal lines L2 and L2' are connected through P channel enhancement field effect transistors T4 and T4', respectively, to the voltage source +VDD. The gate electrodes of the field effect transistors T4 and T4' are grounded so that the transistors T4 and T4' are normally conductive and serve as resistors. The data signal line L2 is connected through an N channel enhancement field effect transistor T1 to the ground GND. The gate electrode of the field effect transistor T1 constitutes a data input signal line DIN. Similarly, the data signal line L2' is connected through an N channel enhancement field effect transistor T1' to the ground GND. The gate electrode of the field effect transistor T1' constitutes another data input signal line DIN'.

First consider a read operation mode of the FIG. 1 diagram. To that end, let it be assumed that the address signal line L1 is selected or addressed, namely the address signal line L1 is brought to the voltage level of the voltage source +VDD or to the logic one. As a result, the field effect transistors T2 and T2' become conductive. Therefore, the storing state of the flip-flop is outputted to the data signal lines L2 and L2' by way of the output signals DOUT and $\overline{DOUT}$ which are complementary. Consider a storing state in the flip-flop in more detail. By way of an example, assuming that the field effect transistors T3' and T5 are turned on and the field effect transistors T3 and T5' are turned off, the junction between the transistors T3' and T5' becomes the high level or true, which is outputted through the data signal line L2', while the junction between the transistors T3 and T5 becomes the low level or false which is outputted through the data signal line L2. The high level at the junction between the transistors T3' and T5' causes the transistor T3 to be turned off and the transistor T5 to be turned on, while the low level at the junction between the transistors T3 and T5 causes the transistor T3' to be turned on and the transistor T5' to be turned off, whereby the above described storing state of the flip-flop is established. Assuming the reverse conduction state in each transistor, then the reverse storing state is established in the flip-flop and the corresponding data output is obtained in each of the data signal lines L2 and L2'. It is pointed out that, although not shown in FIG. 1 the data input signal lines DIN and DIN' are both adapted to be brought to the low level so that the transistors T1 and T1' are turned off in the read operation mode.

Now consider a write operation mode. To that end, again let it be assumed that the address signal line L1 is selected or addressed, so that the address signal line L1 is brought to the high level or the logic one. Therefore the transistors T2 and T2' are turned on and accordingly the storing cell implemented by the transistors T3, T5, T3' and T5' is addressed or selected. Assuming further that the input data signal DIN is the logic one and the data input signal DIN' is the logic zero, then the field effect transistor T1 is turned on while the field effect transistor T1' is turned off. As a result, the data signal line L2 is forced to the voltage level of the ground GND or to the low level, while the data signal line L2' is brought to the voltage level of the voltage source +VDD or to the high level. The voltage levels in these data signal lines L2 and L2' are applied through the transmission gates T2 and T2' to the flip-flop as an input data signal of the logic one, whereby the corresponding storing state is established in the flip-flop.

It has been observed that a problem is encountered with the FIG. 1 random access memory in the read operation mode. For the purpose of considering such a problem, let it be assumed that a storing state has been established in the flip-flop wherein the field effect transistors T3 and T5' are turned on and the field effect transistors T3' and T5 are turned off, whereby the junction between the transistors T3 and T5 is the high level and the junction between the transistors T3' and T5' is the low level. Before the field effect transistors T2 and T2' are turned on, the data signal lines L2 and L2' are in the voltage level of the voltage source +VDD. If and when the address signal line L1 is brought to the high level for the purpose of addressing the storing cell in the read operation mode and the field effect transistors T2 and T2' are turned on, then the high level potential at the junction between the transistors T3 and T5 is coupled to the data signal line L2 which is the high level at that time, while the low level at the junction between the transistors T3' and T5' is coupled to the data signal line L2' which is also the high level, with the result that the high level at the data signal line L2' must be forced to the low level. Such a change of the voltage level at the data signal line L2' is effected by conduction through the field effect transistors T2' and T5' to the ground GND. However, a direct current path is formed from the voltage source +VDD through the field effect transistors T4', T2' and T5' now in conduction to the ground GND. Assuming that the resistance across the field effect transistor T5' is large, then the voltage level at the junction between the transistors T3' and T5' approaches the voltage level of the voltage source +VDD, with the result of fear that the data stored in the storing cell is destroyed. Thus, from the standpoint of the read operation mode, the resistance across the field effect transistor T5' must be smaller. Assuming a reverse storing state of the flip-flop, then the resistance of the field effect transistor T5 must also be smaller.

With the FIG. 1 random access memory, another problem is encountered in the write operation mode. For the purpose of considering the problem, again assume a storing state in the flip-flop wherein the field effect transistors T3 and T5' are turned on while the field effect transistors T3' and T5 are turned off, whereby the junction between the transistors T3 and T5 is the high level while the junction between the transistors T3' and T5' is the low level. No problem occurs when the same data input signal as the storing state of the flip-flop is applied to the flip-flop and no change of the storing state occurs in the flip-flop. However, a problem occurs in conjunction with the change of the storing state in the flip-flop as a result of the writing operation in the flip-flop. Now consider a case where inversion of the storing state occurs in the flip-flop. Then, the high level at the junction between the transistors T3 and T5 must be forced to the low level. To that end, the logic one or the high level signal is applied to the data input signal line DIN and the logic zero or the low level signal is applied to the data input signal line DIN'. As a result, the field effect transistor T1 is turned on. In such a situation, a direct current path is formed between the voltage source +VDD and the ground GND through the transistors T1, T2, and T3 now in conduction. In such a situation, the resistance of the transistor T1 must be sufficiently small enough to fully force the potential at the junction between the transistors T3 and T5 to the ground through the transistors T2 and T1. Considering a reverse state, the resistance of the transistor T1' also must be sufficiently small. Considering the transistors T1 and T3', the resistance of the transistors T3 and T3' must be sufficiently larger than the resistance of both transistors T1 and T2, and both transistors T1' and T2', respectively. Considering further the transistors T4 and T4' normally in conduction, the resistance of the transistors T1 and T1' must be sufficiently small enough to allow a current to flow through both the transistors T4 and a series connection of the transistors T2 and T3 and both the transistor T4' and a series connection of the transistors T2' and T3', respectively.

In summary, with the FIG. 1 random access memory, the field effect transistors included therein must be ratioed as expressed as follows in terms of the resistance thereof.

T3 > T2 + T1
T2 + T4 > T5
T4 > T1

The fact that the field effect transistors must be ratioed in designing the same causes an increase of the area, difficulty in designing and an increase in power dissipation, as well known to those skilled in the art.

SUMMARY OF THE INVENTION

Briefly described, the present invention comprises a random access memory using complementary field effect devices, comprising an array of a plurality of storing locations, address signal lines for addressing said plurality of storing locations, and a data signal line commonly coupled to said plurality of storing locations for inputting/outputting a data signal, each said location comprising storing means including first and second inverter means cross connected to each other each implemented by complementary field effect devices, field effect switching devices connected in series with said first inverter means and to be non-conductive in a write operation mode, transmission gate means connected between the input/output node of said storing means and said data signal line to be operable as a function of the signal in said address signal line, said transmission gate means comprising two complementary field effect switching devices connected in parallel with each other, each individually responsive to the complementary states of said address signal line, said random access memory further comprising third inverter means implemented by complementary field effect devices and having the output connected to said data signal line, and field effect switching devices connected in series with said third inverter means and to be conductive in the write operation mode. Since the first inverter means is brought in a non-conductive state in a write operation mode, no direct current path is formed through the first inverter means, transmission gate means and third inverter means. As a result, a ratioless circuit configuration can be made in conjunction with the first inverter means, the transmission gate means and the third inverter means.

Therefore, a principal object of the present invention is to provide an improved random access memory using complementary field effect devices.

Another object of the present invention is to provide an improved random access memory using complementary field effect devices wherein a circuit configuration is made ratioless.

A further object of the present invention is to provide an improved random access memory using complementary field effect devices wherein the area for the complementary field effect devices is made small.

Still another object of the present invention is to provide an improved random access memory using complementary field effect devices wherein design of the circuit configuration is facilitated.

Still a further object of the present invention is to provide an improved random access memory using complementary field effect devices wherein power dissipation is minimized.

These objects and other objects, features, aspects and advantages of the present invention will become more apparent from the following detailed description of the present invention when taken in conjunction with the accompanying drawings.

DESCRIPTION OF THE PREFERRED EMBODIMENT

Figure 1:
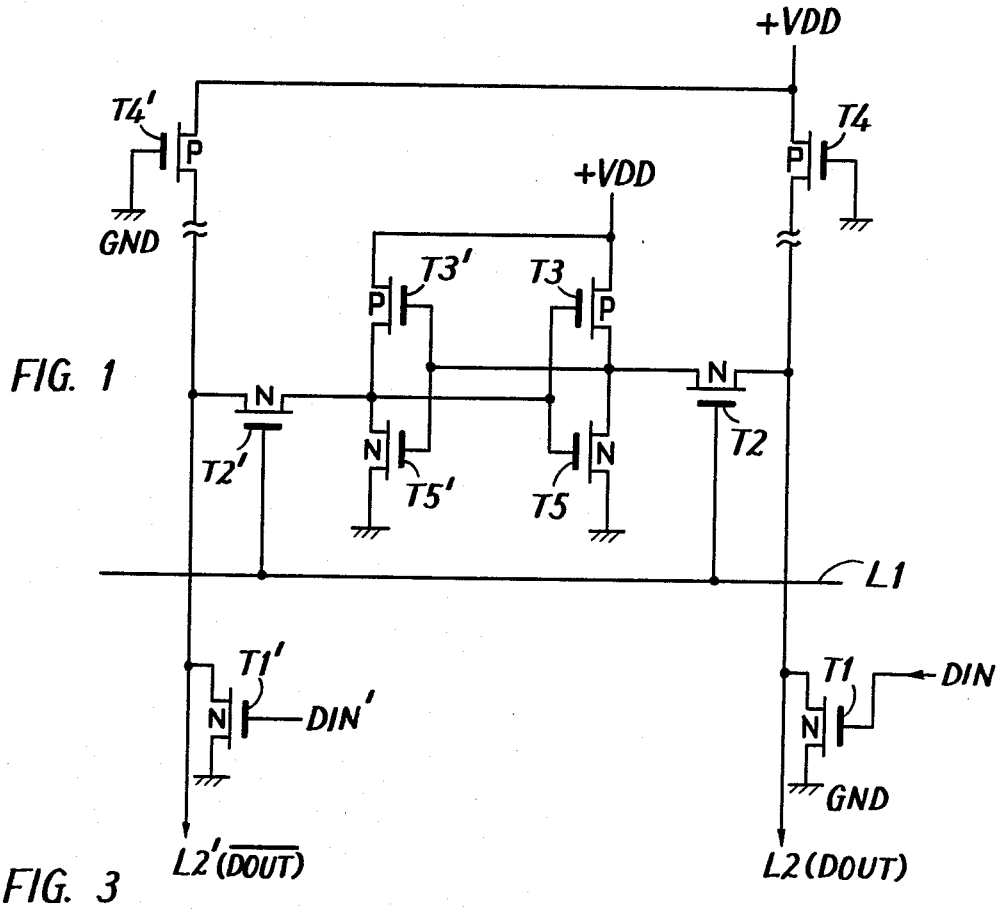
FIG. 1 shows a schematic diagram of a typical prior art static type random access memory implemented by complementary field effect transistors.
Figure 3:
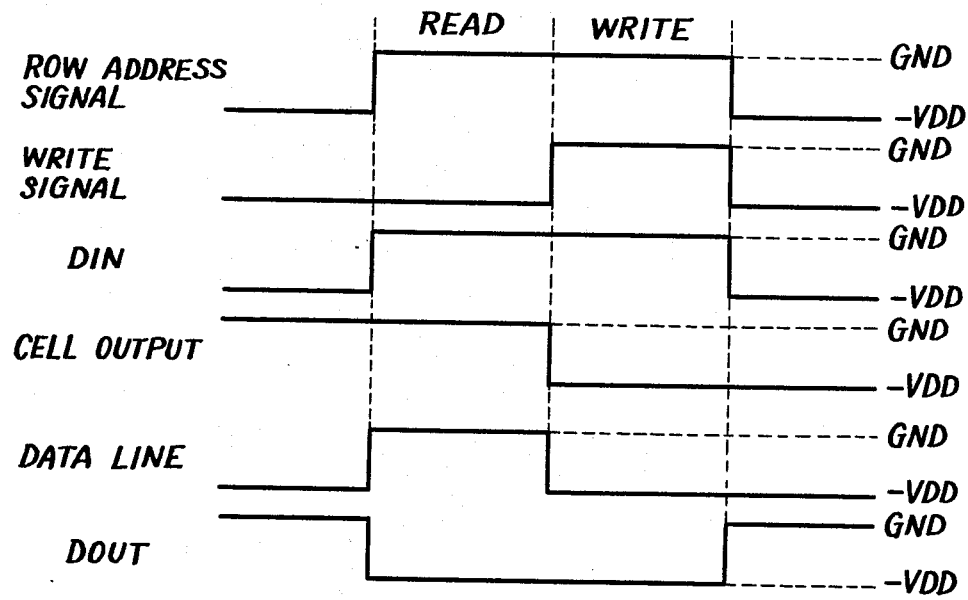
FIG. 3 shows wave forms of the signals at various portions in the FIG. 2 embodiment.
Figure 2:
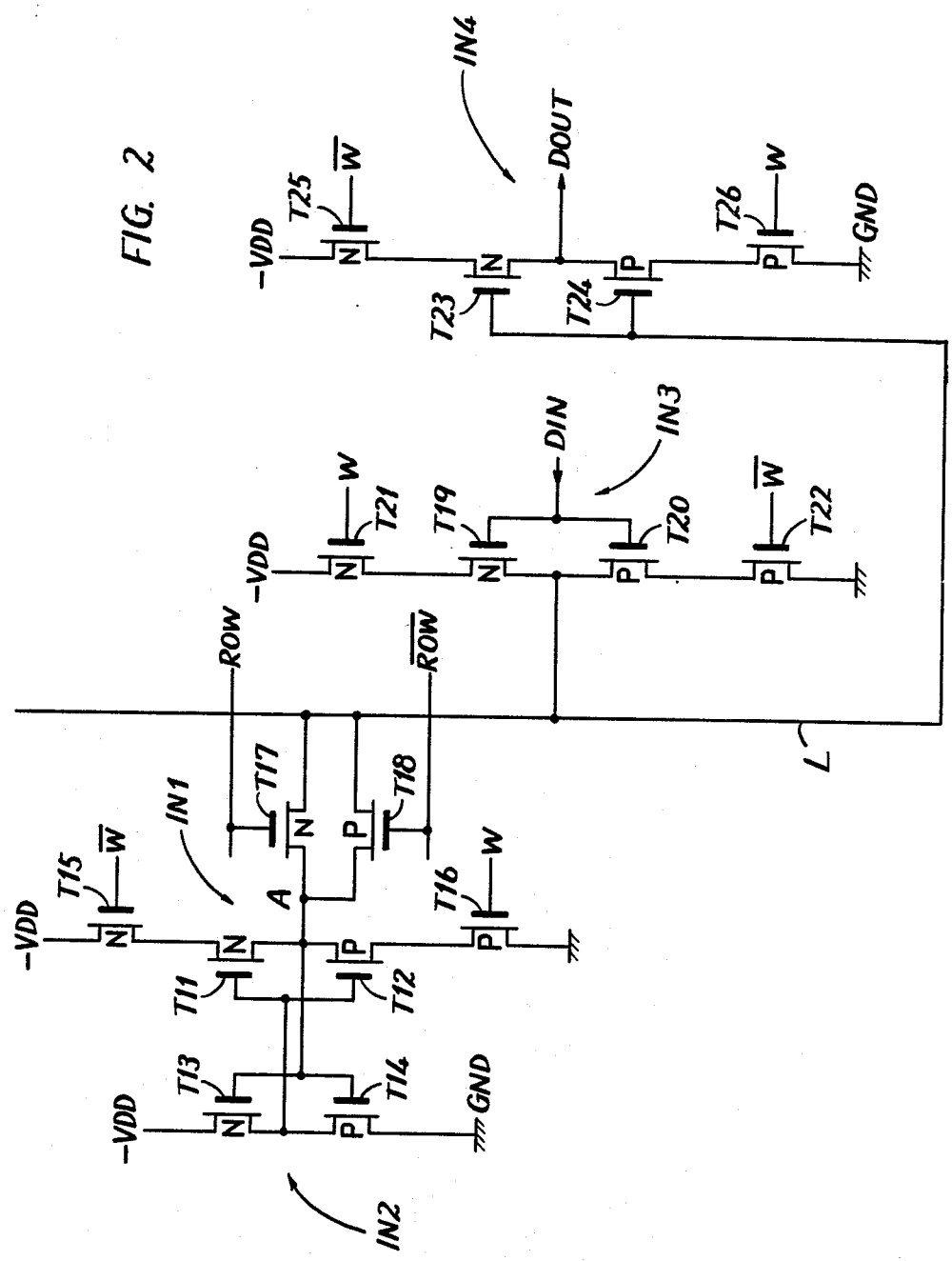
FIG. 2 shows a schematic diagram of a static type random access memory implemented by complementary field effect transistors in accordance with the present invention.

FIG. 2 shows a schematic diagram of a static type random access memory implemented by complementary field effect transistors in accordance with the present invention. FIG. 3 shows wave forms of the signals at various portions in the FIG. 2 embodiment. It is pointed out that FIG. 2 also shows only one storing cell, and an address signal line and a data signal line to be connected thereto, and a data write inverter and a data output inverter connected to the data signal line. Typically, the complementary field effect transistors comprise a pair of a P channel enhancement field effect transistor and an N channel enhancement field effect transistor. In the figure, a P channel enhancement field effect transistor is denoted by the reference character P indicated adjacent to the symbol of the field effect transistor and the N channel enhancement field effect transistor is denoted by the reference character N indicated adjacent the symbol of the field effect transistor. It is further pointed out that the circuit is shown connected between the voltage source −VDD and the ground GND. Therefore, as far as the description in conjunction with FIG. 2 is concerned, the logical convention is adopted wherein the voltage level of the ground GND is handled as true or the logic one or the high level while the voltage level of the voltage source −VDD is handled as false or the logic zero or the low level.

The circuit diagram in FIG. 2 comprises one storing cell, as described above, which is implemented by a pair of inverters IN1 and IN2, one comprising an N channel enhancement field effect transistor T11 and a P channel enhancement field effect transistor T12 and the other comprising an N channel enhancement field effect transistor T13 and a P channel enhancement field effect transistor T14. The junction A of the field effect transistors T11 and T11 of the first inverter IN1 is connected to the gates of the field effect transistors T13 and T14 of the second inverter IN2, while the junction between the field effect transistors T13 and T14 is connected to the gate electrodes of the field effect transistors T11 and T12 of the first inverter IN1, whereby a cross connection of the pair of inverters IN1 and IN2 is implemented to form a flip-flop, which serves as a storing cell. The second inverter IN2 is connected directly between the voltage source −VDD and the grund GND, while the first inverter IN1 is connected between the voltage source −VDD and the ground GND through an N channel enhancement field effect switching transistor T15 and a P channel enhancement switching transistor T16, respectively, such that the gate electrode of the field effect transistor T15 is supplied with an inverted write signal $\overline{W}$ (see FIG. 3) and the gate electrode of the field effect transistor T16 is supplied with a write signal W (see FIG. 3) in order that these field effect transistors T15 and T16 may be turned off at a write operation mode.

The junction A of the field effect transistors T11 and T12 of the first inverter IN1 is connected to a data signal line L through a transmission gate. The transmission gate comprises two complementary field effect switching transistors T17 and T18 connected in parallel with each other. The field effect transistor T17 comprises an N channel enhancement field effect transistor the gate electrode of which is connected to a row address signal line ROW (see FIG. 3), while the field effect transistor T18 comprises a P channel enhancement field effect transistor the gate electrode of which is connected to an inverted row signal line $\overline{ROW}$ (see FIG. 3). It is pointed out that although only one storing cell and the transmission gate therefor is shown in the figure, as a matter of practice a plurality of storing cells and the transmission gates therefor are provided, so that a data signal line L is commonly coupled through the respective transmission gates to a plurality of storing cells implemented by the flip-flops.

The data signal line L is connected to the output terminal of a write operation inverter IN3. The inverter IN3 comprises a series connection of complementary field effect transistors T19 and T20. The field effect transistor T19 comprises an N channel enhancement field effect transistor, while the field effect transistor T20 comprises a P channel enhancement field effect transistor. The junction of the transistors T19 and T20 serving as the output thereof is connected to the data signal line L, while the gate electrodes of the transistors T19 and T20 are connected to a data input signal line DIN. The inverter IN3 is connected between the voltage source −VDD and the ground GND through an N channel enhancement field effect transistor T21 and a P channel enhancement field effect transistor T22, respectively. The gate electrode of the field effect transistor T21 is connected to receive a write signal W, while the gate electrode of the field effect transistor T22 is connected to receive an inverted write signal $\overline{W}$, so that these field effect transistors T21 and T22 become conductive in the write operation mode.

The data signal line L is also connected to the input to a fourth inverter IN4, the output DOUT of which is connected to provide a data output. The inverter IN4 comprises a series connection of an N channel enhancement field effect transistor T23 and a P channel enhancement field effect transistor T24, which are complementary to each other. The junction between these field effect transistors T23 and T24 constitutes the above described data output terminal DOUT, while the gate electrodes of these field effect transistors T23 and T24 are commonly connected to the data signal line L. The inverter IN4 is connected between the voltage source $-VDD$ and the ground GND through an N channel enhancement field effect transistor T25 and a P channel enhancement field effect transistor T26, respectively. The gate electrode of the field effect transistor T25 is connected to receive an inverted write signal $\overline{W}$, while the gate electrode of the field effect transistor T26 is connected to receive a write signal W, so that the field effect transistors T25 and T26 become conductive in the read operation mode.

As described previously, the embodiment is shown as comprising only a row address signal line, while a column address signal line is omitted. If desired, for the purpose of an addressing operation with respect to a column, column addressing field effect switching transistors may be connected in series with the third and fourth inverters IN3 and IN4 such that the inverters IN3 and IN4 are selectively enabled or disabled as a function of the column address signal, whereby a desired column in the array of the cells can be selected. In such an embodiment, all the data input signal lines are commonly connected and similarly all the data output signal lines are also commonly connected to form a single data input signal line and a single data output signal line, respectively.

In operation, first let it be assumed that the storing cell shown in the FIG. 2 is addressed or selected among a plurality of storing cells of the array in the inventive random access memory. To that end the row address signal line ROW is brought to the logic one and accordingly the inverted row address signal line $\overline{ROW}$ is brought to the logic zero. As a result, both the field effect transistors T17 and T18 become conductive. Thus, the transmission gate is opened for transmission of the data therethrough. In such a situation, the data in the flip-flop is allowed to pass therethrough toward the data signal line L in the read operation mode, while the data on the data signal line is allowed to pass therethrough toward the flip-flop in the write operation mode.

Now consider a case where the circuit is in the read operation mode. Referring to FIG. 3, the write signal W is in the low level or the logic zero in the read operation mode. As a result, both the field effect transistors T15 and T16 are driven hard and become conductive. For the purpose of describing the operation, further let it be assumed that a storing state has been established in the flip-flop such that the junction A between the field effect transistors T11 and T12 is in the high level or the voltage level of the ground GND while the junction between the field effect transistors T13 and T14 is in the low level or the voltage level of the voltage source $-VDD$. In such a situation the field effect transistors T12 and T13 have become conductive, while the field effect transistors T11 and T14 have become non-conductive. The high level output of the flip-flop obtainable at the junction A is transferred through the transmission gate implemented by the field effect transistors T17 and T18 now in conduction to the data signal line L.

Now consider the operation of the transmission gate in more detail. According to the present invention, the transmission gate is implemented by a parallel connection of complementary field effect transistors T17 and T18, which are supplied with the complementary row address signals, respectively, such that both field effect transistors T17 and T18 are brought to be conductive. This parallel connection of the complementary field effect transistors serves to transfer the data effectively in any directions in any operation modes. More specifically, if the transmission gate had been implemented only by the field effect transistor T17, then the data of the high level obtainable at the junction A would have been transferred to the data line L only through the field effect transistor T17 with an inherent threshold voltage drop therethrough. The reason is that in the assumed situation the source or drain region of the field effect transistor T17 is substantially in the voltage level of the ground GND, while the gate electrode of the field effect transistor T17 is also in the voltage level of the ground GND. As well known to those skilled in the art, if and when an N channel enhancement field effect transistor is driven such that the gate electrode thereof is supplied with substantially the same potential at the source or drain region thereof, the field effect transistor is not driven sufficiently hard enough to overcome the threshold voltage drop. However, according to the present invention the N channel enhancement field effect transistor T17 has been shunted with the P channel enhancement field effect transistor T18 the gate electrode of which has been supplied with the inverted row address signal $\overline{ROW}$. Since the source or drain region of the field effect transistor are substantially in the voltage level of the ground GND, while the gate electrode thereof is in the voltage level of the voltage source $-VDD$ in such a situation, the P channel enhancement field effect transistor T18 is driven sufficiently hard enough to overcome the threshold voltage drop. As a result, the data of the high level obtainable at the junction A at that time is effectively transferred through the transmission gate and primarily through the P channel enhancement field effect transistor T18 to the data signal line L.

Now consider a reversed sitatuion of the data voltage level, i.e. the low voltage level at the junction A between the transistors T11 and T12 and the high voltage level at the junction between the transistors T13 and T14. In such a situation one electrode of the field effect transistors T17 and T18 is substantially in the voltage level of the voltage source $-VDD$. However, the gate electrode of the field effect transistor T17 is in the voltage level of the ground GND, as described previously. Therefore, the N channel enhancement field effect transistor is driven hard enough in such a situation to overcome the threshold voltage drop at that time. On the other hand, the field effect transistor T18 is driven less hard, inasmuch as one electrode of the field effect transistor T18 is in the voltage level of the voltage source $-VDD$, while the gate electrode of the field effect transistor T18 is also in the voltage level of the voltage source $-VDD$, with the result that a threshold voltage drop occurs therethrough. As a result, the data of the low level obtainable at the junction A is effectively transferred through the transmission gate primarily through the field effect transistor T17 this time to the data line L.

Now consider the operation of the transmission gate in the write operation mode. As understood from the previous description, in the write operation mode, the transfer direction of the data through the transmission gate is reversed as compared with that in the read operation mode. Except for only the reversed transfer direction through the transmission gate, substantially the same operation occurs even in the read operation mode. More specifically, the data signal of the high level or the low level at the data signal line L is effectively transferred toward the flip-flop through the transmission gate without any threshold voltage drop. The voltage level representative of the data at the data signal line is determined by the output from the third inverter IN3. Thus, it is understood that according to the present invention the data is effectively transferred through the transmission gate among the storing cell and the data signal line without any problem of the threshold voltage drop across the field effect transistors implementing the transmission gate.

Consider again the operation of the embodiment shown in the read operation mode. Since the write signal W is in the low level or the voltage level of the voltage source −VDD, the field effect transistors T15 and T16 connected in series with the first inverter IN1 implemented by the field effect transistors T11 and T12 are turned on, and the field effect transistors T25 and T26 connected in series with the fourth inverter IN4 are also turned on, while the field effect transistors T21 and T22 connected in series with the third inverter IN3 are turned off. If and when the storing cell shown is addressed or selected, the row address signal line ROW becomes the high level while the inverted row address signal line $\overline{\text{ROW}}$ becomes the low level. As a result, both the field effect transistors T17 and T18 are turned on. Therefore, the output of the storing cell or the flip-flop implemented by the first and second inverters IN1 and IN2 is effectively transferred through the transmission gate to the data signal line L. The data represented by the high level or the low level at the data signal line L is applied to the fourth inverter IN4, where the data signal is inverted and is withdrawn at the output terminal DOUT. As described previously, in this read operation mode, the data in the flip-flop is effectively transferred to the data signal line L without any loss by virtue of the threshold voltage drop across the field effect transistors T17 and T18 implementing the transmission gate.

Now consider the operation of the FIG. 2 embodiment in the write operation mode. In the write operation mode, the write signal W becomes the high level while the inverted write signal $\overline{\text{W}}$ becomes the low level. As a result the field effect transistors T21 and T22 both become conductive. Therefore, the data input signal applied to the data input signal line DIN is inverted by the inverter IN3 and is obtained by the data signal line L. Since the write signal W is the high level and the inverted write signal $\overline{\text{W}}$ is the low level in this write operation mode, the field effect transistors T15 and T16, and T25 and T26 are turned off. As a result, the inverters IN1 and IN4 are isolated from the power supply −VDD and the ground GND. Assuming that the storing cell in the FIG. 2 diagram is addressed, the row address signal line is the high level while the inverted row address signal line $\overline{\text{ROW}}$ is the low level. As a result, the field effect transistors T17 and T18 are turned on. Therefore, the input data obtainable at the data signal line L is effectively transferred through the transmission gate to the junction A of the flip-flop implemented by the inverters IN1 and IN2.

Since in the write operation mode the field effect transistors T15 and T16 are turned off as described previously and hence the inverter IN1 is isolated from the voltage supply −VDD, no direct current path is formed through the third inverter IN3, the transmission gate and the first inverter IN1. As a result, the data obtainable at the data signal line L is transferred from the third inverter IN3 to the junction A without any threshold voltage drop and any power dissipation. The fact that no direct current path is formed in the write operation mode makes it possible to configure the circuitry including the third inverter IN3, the transmission gate and the first inverter IN1 as ratioless. As a result, various advantages of a ratioless circuit can be brought.

In the read operation mode, the write signal W is the low level, while the inverted write signal $\overline{\text{W}}$ is the high level. As a result, the field effect transistors T15 and T16 are turned on. However, the field effect transistors T21 and T22 are turned off. Therefore, in this write operation mode, no direct current path is formed through the first inverter IN1, the transmission gate and the third inverter IN3. Therefore the data in the storing cell is effectively transferred through the above described path without any threshold voltage drop and power dissipation. This fact makes it possible to configure the circuit of the inverter IN3, the transmission gate and the inverter IN1 as ratioless.

Again consider the operation of the FIG. 2 circuit in the write opreration mode. In the write operation mode, the output from the inverter IN3 is obtained at the data signal line L, which is transferred through the transmission gate to the storing cell and at the same time to the fourth inverter IN4. However, in the write operation mode, the field effect transistors T25 and T26 has been turned off, whereby the inverter IN4 has been isolated from the power supply −VDD and from the ground GND. This ensures that the fourth inverter IN4 is disabled in the write operation mode and therefore the data obtainable at the data signal line L is not obtained through the inverter IN4 at the data output terminal DOUT.

In the foregoing, only one storing cell was considered among a plurality of storing cells forming an array of the random access memory. As described previously, the random access memory comprises an array of a plurality of storing cells, a corresponding plurality of row address signal lines, and a data signal line commonly connected thereto, thereby to form a column of the storing cells. If desired, however, a plurality of such columns may be provided, wherein a corresponding plurality of data signal lines are provided and a column address circuit is accordingly formed, as described previously.

Although the present invention has been described and illustrated in detail, it is to be clearly understood that the same is by way of illustration and example only and is not to be taken by way of limitation, the spirit and scope of this invention being limited only by the terms of the appended claims.

What is claimed is:

1. A random access memory using complementary field effect devices, comprising an array of a plurality of storing locations, address signal lines for addressing said plurality of storing locations, a data signal line commonly coupled to said plurality of storing locations for inputting/outputting a data signal, each said location comprising a storing cell including first and second inverter means cross connected to each other and each implemented by complementary field effect devices and having an input/output node, field effect switching means connected in series with said first inverter means and adapted to be non-conductive in a write operation mode, transmission gate means connected between said input/output node of said storing means and said data signal line to be operable as a function of the signal in said address signal line, said transmission gate means comprising two complementary field effect switching devices connected in parallel with each other, each individually responsive to the complementary state of the signal in said address signal line, said random access memory further comprising third inverter means implemented by complementary field effect devices and having the output connected to said data signal line, and field effect switching means connected in series with said third inverter means and adapted to be conductive in the write operation mode.

2. A random access memory in accordance with claim 1, which further comprises output circuit means having the input connected to said data signal line and implemented by complementary field effect devices.

3. A random access memory in accordance with claim 2, wherein said output circuit means comprises fourth inverter means having the input connected to said data signal line and implemented by complementary field effect devices.

4. A random access memory in accordance with claim 3, which further comprises field effect switching means connected in series with said fourth inverter means and adapted to be non-conductive in a write operation mode.

* * * * *